(12) United States Patent
DeBoer et al.

(10) Patent No.: US 6,964,909 B1
(45) Date of Patent: Nov. 15, 2005

(54) METHOD OF FORMING A CAPACITOR ELECTRODE HAVING AN INTERFACE LAYER OF DIFFERENT CHEMICAL COMPOSITION FROM A BULK LAYER

(75) Inventors: Scott J. DeBoer, Boise, ID (US); Don C. Powell, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/931,511

(22) Filed: Sep. 1, 2004

Related U.S. Application Data

(62) Division of application No. 09/615,549, filed on Jul. 13, 2000, now Pat. No. 6,825,522.

(51) Int. Cl.[7] .................. H01L 21/477; H01L 21/8242
(52) U.S. Cl. ...................... 438/393; 438/396; 438/250; 438/253
(58) Field of Search ............................... 438/239, 243, 438/250, 253, 255, 386, 393, 396, 398

(56) References Cited

U.S. PATENT DOCUMENTS

| | | | |
|---|---|---|---|
| 5,032,545 A | 7/1991 | Doan et al. | |
| 5,438,012 A | 8/1995 | Kamiyama | |
| 5,639,685 A | 6/1997 | Zahurak et al. | |
| 5,663,088 A | 9/1997 | Sandhu et al. | |
| 5,712,182 A | 1/1998 | Madan | |
| 5,759,262 A | 6/1998 | Weimer et al. | |
| 5,882,979 A | 3/1999 | Ping et al. | |
| 5,933,727 A | 8/1999 | Figura | |
| 6,027,970 A | 2/2000 | Sharan et al. | |
| 6,071,771 A * | 6/2000 | Schuegraf | 438/240 |
| 6,124,161 A | 9/2000 | Chern et al. | |
| 6,146,959 A * | 11/2000 | DeBoer et al. | 438/393 |
| 6,180,481 B1 * | 1/2001 | Deboer et al. | 438/396 |
| 6,228,737 B1 | 5/2001 | Inoue | |
| 6,303,972 B1 * | 10/2001 | Agarwal | 257/532 |
| 6,350,648 B1 | 2/2002 | Ping et al. | |

(Continued)

OTHER PUBLICATIONS

Hamada, et al., A High Performance 0.18- $\mu$m Merged DRAM/Logic Technology Featuring 0.45- $\mu$m2 Stacked Capacitor Cell, 4 pages, 1999.

(Continued)

*Primary Examiner*—Anh Duy Mai
(74) *Attorney, Agent, or Firm*—Knobbe Martens Olson & Bear LLP

(57) ABSTRACT

An improved capacitor that is less susceptible to the depletion effect and methods for providing the same. The capacitor comprises a first and second electrode and an insulating layer interposed therebetween. The first electrode includes a bulk layer comprising n-doped polysilicon. The first electrode also includes an interface layer extending from a first surface of the bulk layer to the insulating layer. The interface layer is heavily doped with phosphorus so that the depletion region of the first electrode is confined substantially within the interface layer. The method of forming the interface layer comprises depositing a layer of hexamethldisilazane (HMDS) material over the first surface of the bulk layer so that HMDS molecules of the HMDS material chemically bond to the first surface of the bulk layer. The method further comprises annealing the layer of HMDS material in a phosphine ambient so as to replace $CH_3$ methyl groups with $PH_3$ molecules. The interface layer is then passivated in a nitrogen ambient having a reduced temperature so as to reduce the number of dangling silicon bonds of the lower electrode in a manner that results in reduced thermal damage to neighboring circuit elements.

16 Claims, 6 Drawing Sheets

U.S. PATENT DOCUMENTS 6,475,883 B2 * 11/2002 Powell et al. ............... 438/486

OTHER PUBLICATIONS

Y. Ohji et al., Ta2O5 Capacitors Dielectric Material for Giga-bit DRAMs. IEDM 1995, pp. 111-114.

S. Kamiyama et al., Ultra Thin TiN/Ta2O5/W Capacitor Technology for 1GBit DRAM. IEDM 1993, pp. 49-52.

Q. Lu et al., Leakage Current Comparison Between Ultra-Thin Ta2O5 Films and Conventional Gate Dielectrics, IEEE 1998, pp. 341-342.

* cited by examiner

METHOD OF FORMING A CAPACITOR ELECTRODE HAVING AN INTERFACE LAYER OF DIFFERENT CHEMICAL COMPOSITION FROM A BULK LAYER

RELATED APPLICATIONS

This application is a divisional application of U.S. application Ser. No. 09/615,549 filed Jul. 13, 2000, now U.S. Pat. No. 6,825,522, entitled "A CAPACITOR ELECTRODE HAVING AN INTERFACE LAYER OF DIFFERENT CHEMICAL COMPOSITION FORMED ON A BULK LAYER" which is hereby incorporated by reference in its entirety.

BACKGROUND OF THE INVENTION

1. Field of the Invention

The present invention relates to capacitor structures used in semiconductor devices and, in particular, relates to capacitor structures used to form memory cells in Dynamic Random Access Memory (DRAM) devices.

2. Description of the Related Art

The trend in the semiconductor processing industry has been to provide integrated circuits with increasingly higher circuit densities. Consequently, circuit components, such as capacitors and transistors, disposed within these integrated circuits are required to have reduced dimensions. However, because conventional circuit components having reduced dimensions are often unable to provide an acceptable performance, further improvements in circuit density requires the development of improved circuit components.

For example, a typical high density Dynamic Random Access Memory (DRAM) device may include an array of hundreds of millions of memory cells. Each memory cell usually includes a charge storage capacitor such that the state of charge of the capacitor determines the binary state of the memory cell. Essentially, the capacitor comprises an insulating material interposed between first and second conducting electrodes. Typically, the insulating material is a deposited dielectric material and one or both of the electrodes comprise doped semiconductor material such as doped polysilicon.

When a voltage difference, V, is applied between the electrodes of the capacitor, each electrode develops a charge, Q, according to the linear relationship Q=CV (1), wherein C is the capacitance of the capacitor. The typical capacitor has a capacitance that is approximately proportional to a function of the design parameters of the capacitor according to $$C \propto \frac{\kappa A}{d}, \qquad (2)$$

wherein A is the area of each of the electrodes, d is the distance between the electrodes, and κ is the dielectric constant of the insulating material. Furthermore, each charged capacitor discharges in an exponentially decaying manner with a decay constant, τ, given by τ=RC (3), wherein R is the resistance between the electrodes.

Because capacitors have a tendency to discharge relatively quickly, DRAM devices also incorporate refresh circuitry that periodically and selectively recharges the capacitors so as to enable the DRAM device to store information for extended periods of time. However, since memory cells cannot be accessed while they are being refreshed, it is desirable to extend the time between refresh cycles so as to provide the DRAM device with increased communication speeds. Thus, storage capacitors of DRAM devices are required to have a considerable capacitance so that they can effectively store charge for longer periods of time and, thus, require only a reasonably small refresh frequency.

However, because storage capacitors of higher density DRAM devices are confined within smaller spaces, it is becoming difficult to provide them with sufficient capacitance. Most notably, smaller capacitor size translates into smaller electrode area, A, which, according to (2), results in a decreased capacitance. To provide increased capacitance, one or both electrodes of the storage capacitors can be formed with a roughened surface, such as that which is provided by hemispherical grained (HSG) polysilicon, so as to increase the area over that which is provided by electrodes having planar surfaces. Other methods of providing increased capacitance involve using an insulating material having an increased dielectric constant and reducing the thickness of the dielectric insulating layer so as to reduce the distance between the electrodes.

However, as the distance between the electrodes is reduced, storage capacitors of DRAM devices are becoming more susceptible to the "depletion effect" such that the capacitance drops off in a voltage dependent manner. In particular, when mobile charge carriers are removed from the doped semiconductor electrode in response to an applied voltage, a depletion region substantially devoid of mobile charge carriers develops within the electrode. The depletion region begins at the interface adjacent the insulating layer and progressively extends into the electrode away from the insulating layer as more charge carriers are removed from the electrode. Because the net charge of the electrode is essentially comprised of ionized dopant atoms fixedly disposed throughout the depletion region, further enlargement of the depletion region as a result of further mobile charge carriers being removed from the electrode causes the geometric center of the electrode charge to be displaced away from the interface. Consequently, since the effect of the displacement of the geometric center of charge is identical to that of increasing the separation between the electrodes, i.e., an increase in the variable d in equation (2), the capacitance decreases as the applied voltage to the capacitor is increased.

Attempts have been made to reduce the depletion effect by increasing the doping concentration of the interface region of the electrode using conventional diffusion doping techniques. For example, an N-type polysilicon electrode is usually annealed in a phosphine ($PH_3$) ambient so as to induce phosphorus atoms to diffuse into the electrode. The conditions of this process are chosen so that the doping concentration is greatest near the interface adjacent the insulating layer. However, the maximum achievable concentration is limited by the solid solubility limit of the polysilicon electrode and, if the electrode is exposed to increased temperatures in a subsequent processing step, it is likely that a substantial portion of the dopants will continue to diffuse so as to decrease the doping concentration adjacent the interface.

Thus, known doping methods are only able to provide the interface region of semiconductor electrodes with modest increases in doping concentration. Consequently, because capacitors having reduced sizes will be required in future generation DRAM devices, the problem of carrier depletion requires a more effective solution in order to satisfactorily address the issue of voltage dependent decreases in capacitance.

From the foregoing, therefore, it will be appreciated that there is a need for a miniaturized semiconductor-based capacitor having more stable operating characteristics. In particular, there is a need for the capacitor to have a relatively large capacitance that is more stable in response to a changing applied voltage. To this end, there is a need for the interface region of the semiconductor electrodes of the capacitor to have a greater concentration of doping atoms so as to reduce the effects of charge carrier depletion.

SUMMARY OF THE INVENTION

According to one aspect of the present invention, the aforementioned needs are satisfied by a capacitor comprising a first conducting electrode having a richly doped interface layer. The first conducting electrode comprises a semiconductor bulk layer having a first surface and the interface layer extending from the first surface of the bulk layer. The interface layer comprises a plurality of dopant atoms chemically bonded thereto. The capacitor further comprises a second conducting electrode and an insulating layer interposed between the first and second conducting electrodes such that the insulating layer is disposed adjacent the interface layer of the first conducting electrode.

In another aspect of the invention, a method of forming a capacitor is provided. The method comprises forming a first conducting electrode having a bulk layer and an interface layer chemically bonded to the bulk layer, wherein the interface layer comprises a plurality of doping atoms chemically bonded thereto so as to reduce the extent of the depletion region of the first conducting electrode. The method further comprises forming an insulating layer adjacent the first conducting electrode such that the insulating layer is disposed adjacent the interface layer of the first conducting electrode. The method further comprises forming a second conducting electrode adjacent the insulating layer such that the insulating layer is interposed between the first and second conducting electrodes.

In yet another aspect of the invention, a method of forming a capacitor is provided. The method comprises forming a bulk layer of doped polysilicon and depositing a layer of adhesive material adjacent a first surface of the bulk layer, wherein the adhesive material comprises a plurality of $CH_3$ methyl groups. The method further comprises replacing a substantial portion of the plurality of $CH_3$ methyl groups of the adhesive material with $PH_3$ molecules so as to provide an interface layer having a relatively large concentration of phosphorus dopant atoms. The method further comprises passivating the interface layer so as to inhibit the formation of silicon dioxide therein. The method further comprises depositing an insulating layer adjacent the interface layer and depositing an electrode adjacent the insulating layer.

In still yet another aspect of the present invention, a method of forming a capacitor on a semiconductor wafer is provided. The method comprises forming a first electrode on a surface of the semiconductor wafer, attaching an adhesive layer to an exposed surface of the first electrode, and transforming the adhesive layer into a doped layer. The doped layer is doped so as to provide an increased concentration of charge carriers adjacent an interface surface of the first electrode. The method further comprises forming a dielectric layer on the interface surface of the first electrode and forming a second electrode on the dielectric layer wherein the doped layer inhibits a decrease in the capacitance as a result of a charge carriers being stored on the second electrode.

In one embodiment, attaching an adhesive layer to an exposed surface of the first electrode comprises depositing a layer of material that have a plurality of first components and second components. The plurality of first components are selected to chemically bond to the first electrode. Transforming the adhesive layer comprises replacing at least some of the plurality of second components with dopant atoms to thereby increase the dopant concentration at the interface surface. Attaching the adhesive layer further comprises attaching a layer having a plurality of $CH_3$ methyl groups to the first electrode. Transforming the adhesive layer further comprises replacing a substantial portion of the plurality of $CH_3$ methyl groups of the adhesive material with $PH_3$ molecules so as to provide the interface surface with an increased concentration of phosphorus dopant atoms. Forming the adhesive layer preferably comprises depositing a layer of HMDS material and replacing a substantial portion of the plurality of $CH_3$ methyl groups comprises annealing the layer of HMDS material in a phosphine ambient.

The aspects of the present invention therefore provide a technique whereby capacitors can be produced that have higher doping concentrations at the interface between the dielectric and at least one electrode. The increase in the doping concentration inhibits the formation of extended voltage dependent depletion regions in the electrode that can effectively decrease the capacitance of the capacitor. As the increased doping is achieved through the use of chemical bonding of dopant atoms adjacent the interface, the dopant atoms are less likely to diffuse into the bulk of the electrode material as a result of subsequent processing of the device. These and other objects and advantages of the present invention will become more apparent from the following description taken in conjunction with the accompanying drawings.

DETAILED DESCRIPTION OF THE PREFERRED EMBODIMENT

The illustrated embodiment of the present invention comprises a miniaturized capacitor structure having improved operating characteristics and methods for providing the same. In particular, the capacitor structure is provided with electrodes having increased charge carrier concentrations adjacent an insulating layer such that problems associated with carrier depletion within the electrodes are reduced. Consequently, the capacitor structure is provided with an increased capacitance that is more stable in response to a changing voltage applied between the electrodes.

Improved capacitors formed according to the methods of the illustrated embodiment are particularly useful in the manufacture of DRAM devices. It should be understood, however, that the methods of providing improved capacitors according to the present invention could be used in any application or structure in which it is desirable to include miniaturized capacitors having stable capacitance. Furthermore, the methods of the present invention are particularly well-suited for providing improved capacitors on or above a semiconductor substrate or substrate assembly, referred to herein generally as "substrate," used in forming integrated circuits, such as a silicon wafer, with or without layers or structures formed thereon. It is to be understood that the methods of the present invention are not limited to deposition on silicon wafers; rather, other types of wafers (e.g., gallium arsenide, etc.) can be used as well. Moreover, the capacitors provided by the methods of the present invention are not limited to any particular geometrical configuration. For example, the capacitors described hereinbelow can have parallel planar electrodes, trench-type electrodes, or cylindrically shaped electrodes. Thus, the skilled artisan will find application for the processes and materials discussed below for any of a number of capacitor configurations.

Figure 1:
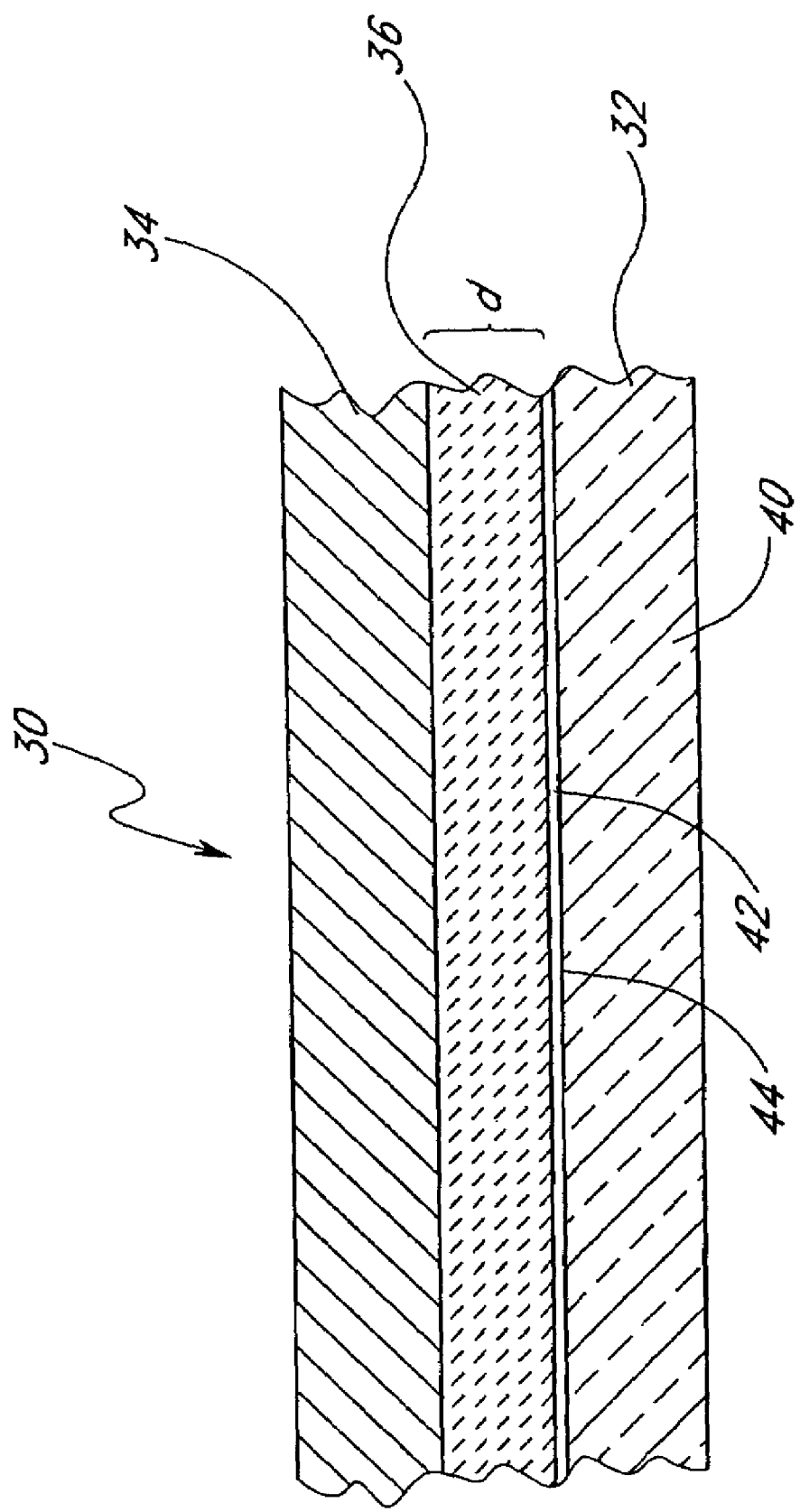
FIG. 1 is a cross-sectional schematic diagram of a capacitor according to one embodiment of the present invention.
Figure 2:
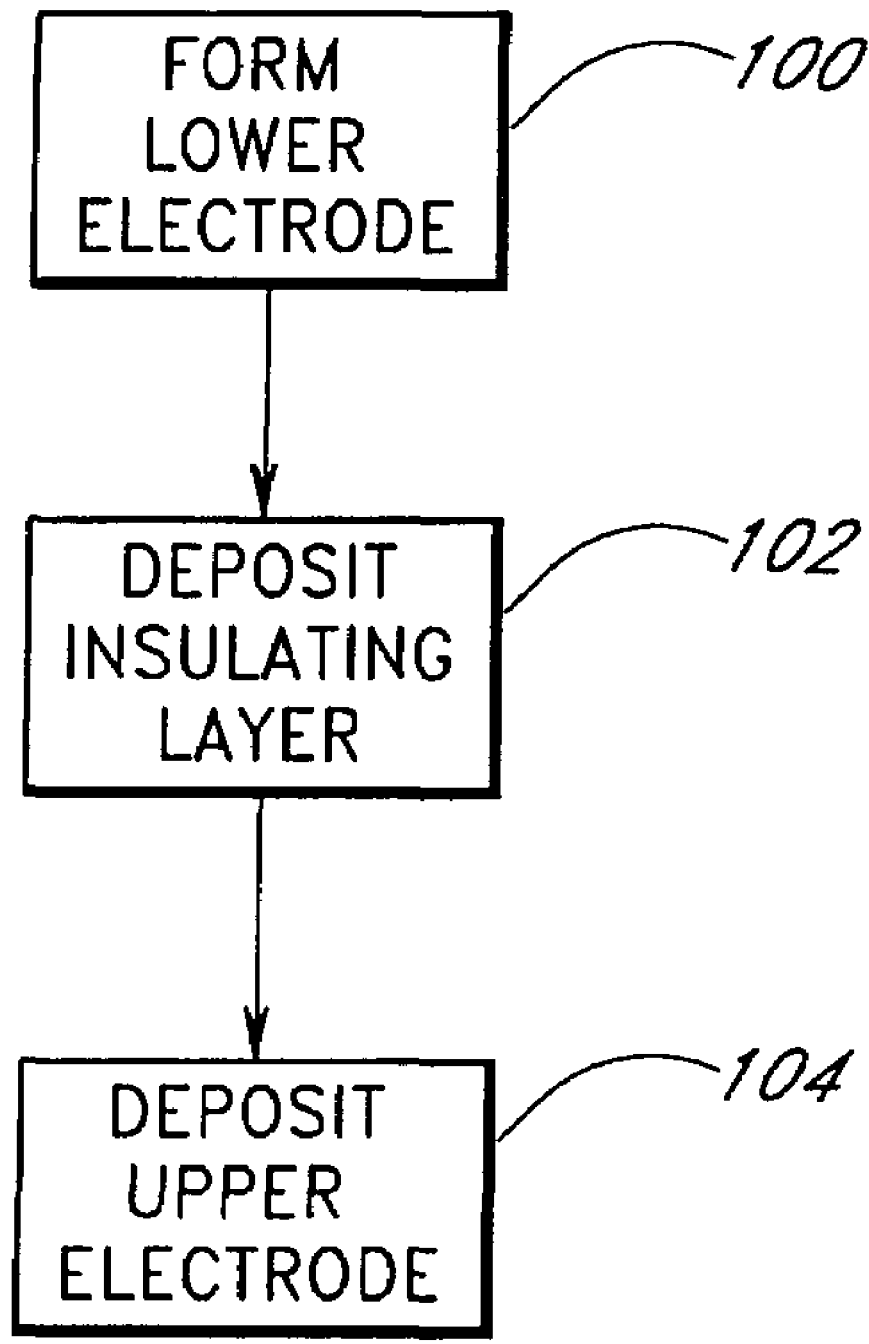
FIG. 2 is a flow diagram describing a method used to form the capacitor of FIG. 1.

Reference will now be made to the drawings wherein like numerals refer to like parts throughout. FIG. 1 illustrates a capacitor 30 in accordance with one embodiment of the present invention and FIG. 2 illustrates a method of providing the same. The capacitor comprises first and second conducting electrodes 32 and 34, otherwise referred to hereinbelow as the lower and upper electrodes 32 and 34. The capacitor 30 further comprises an insulating layer 36 interposed between the electrodes 32 and 34 such that the capacitor 30 has a capacitance that substantially depends on the surface area of the electrodes 32 and 34, the distance, d, between the electrodes 32 and 34, and the dielectric constant of the insulating layer 36. At least one of the first and second electrodes 32, 34 comprises semiconductor material, such as doped polysilicon and the insulating layer 36 comprises any of a number of known high-K insulating dielectrics such as silicon nitride or $Ta_2O_5$.

In one embodiment, the first electrode 32 comprises a bulk layer 40 of polysilicon and a richly doped and relatively thin interface layer 42 extending from the bulk layer 40. The interface layer 42 is interposed between the bulk layer 40 and the insulating layer 36 in a substantially flush manner. The interface layer 42 is heavily doped so that the depletion region of the first electrode 32 caused by the removal of mobile charge carriers from the electrode 32 is confined within the thin interface layer 42 under normal operating conditions. For example, in one embodiment, the interface layer 42 of the first electrode has a thickness of 15 Å and a doping concentration of $1 \times 10^{21}$ Atoms/cm$^3$ so that the thickness of the depletion region of the electrode 32 is less than 5 Å in response to an applied voltage that varies within a range of −3V–3V. In one embodiment, the bulk layer 40 has a thickness of 350 Å and a doping concentration of $4 \times 10^{20}$ Atoms/cm$_3$.

Preferably, the bulk region 40 of the electrode 32 comprises Hemi-Spherical Grained (HSG) polysilicon and the interface layer 42 is conformally deposited thereon so that the electrode 32 has an effective surface area greater than that of a planar surface. Furthermore, the dopant atoms of the first electrode 32 are preferably selected from the pentavalent elements, such as phosphorus, so that the mobile charge carriers of the first electrode 32 are electrons. However, it will be appreciated that, in another embodiment, the interface layer could be deposited during formation of the HSG bulk layer 40 and the dopant atoms could be selected from trivalent atoms so that the mobile charge carriers are holes.

As indicated in FIG. 2, the method of forming the capacitor 30 of FIG. 1 comprises, in a state 100, first forming the first electrode 32 having the richly doped interface layer 42 so as to reduce the severity of the depletion effect. The method of forming the first electrode 32 will be described in greater detail below. The method of forming the capacitor 30 further comprises, in a state 102, depositing the insulating layer 36 adjacent the first electrode in a well known manner and then, in a state 104, depositing the second electrode 34 adjacent the insulating layer 36. In one embodiment, the second electrode 34 is formed in a well known manner. However, in other embodiments, it will be appreciated that the second electrode 34 could comprise a semiconductor material and it could be provided with a similar richly doped interface layer adjacent the insulating layer 36 using the methods described hereinbelow so as to reduce carrier depletion within the second electrode 34.

Figure 3:
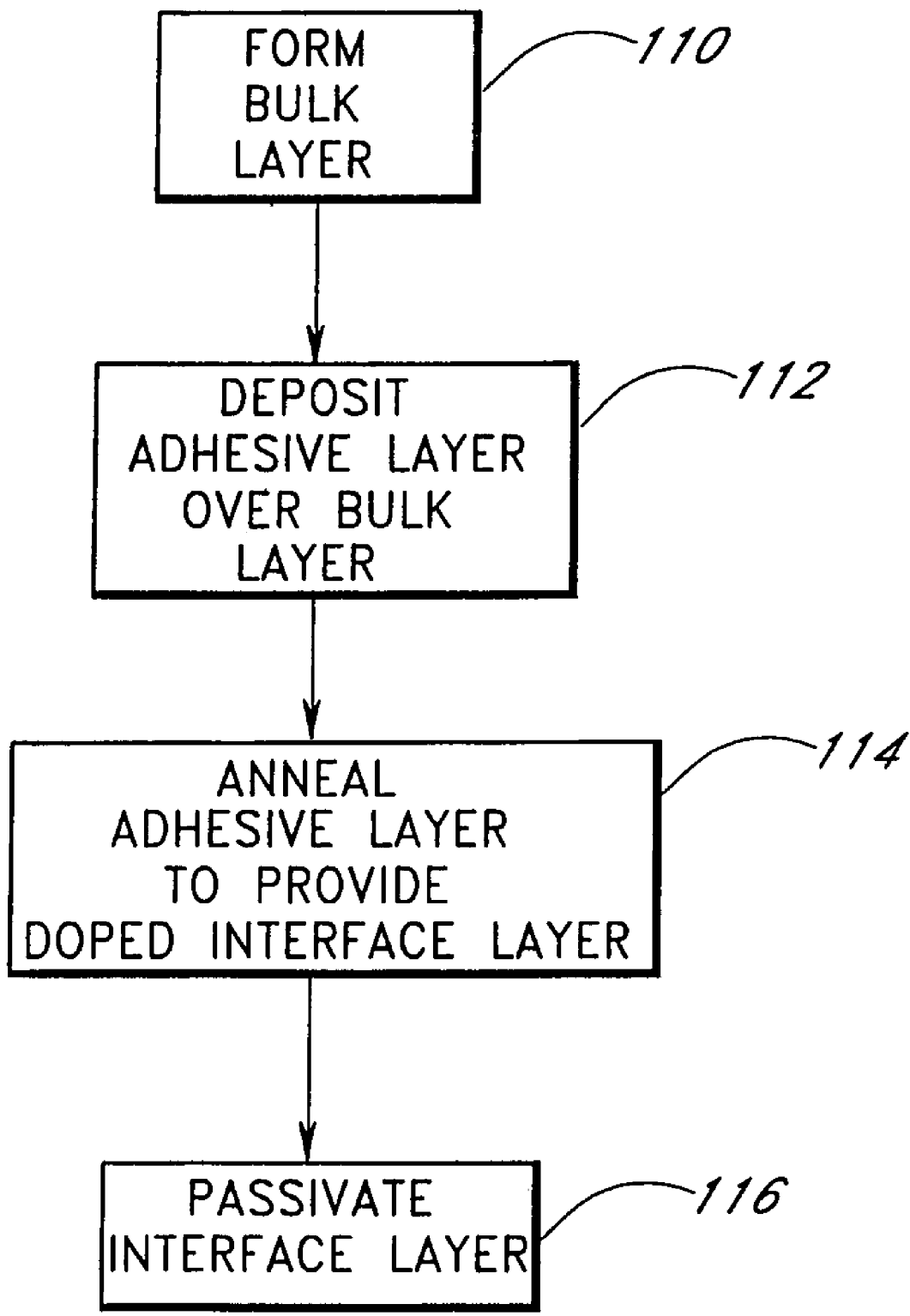
FIG. 3 is a flow diagram describing a method used to form a first electrode of the capacitor of FIG. 1.
Figure 4:
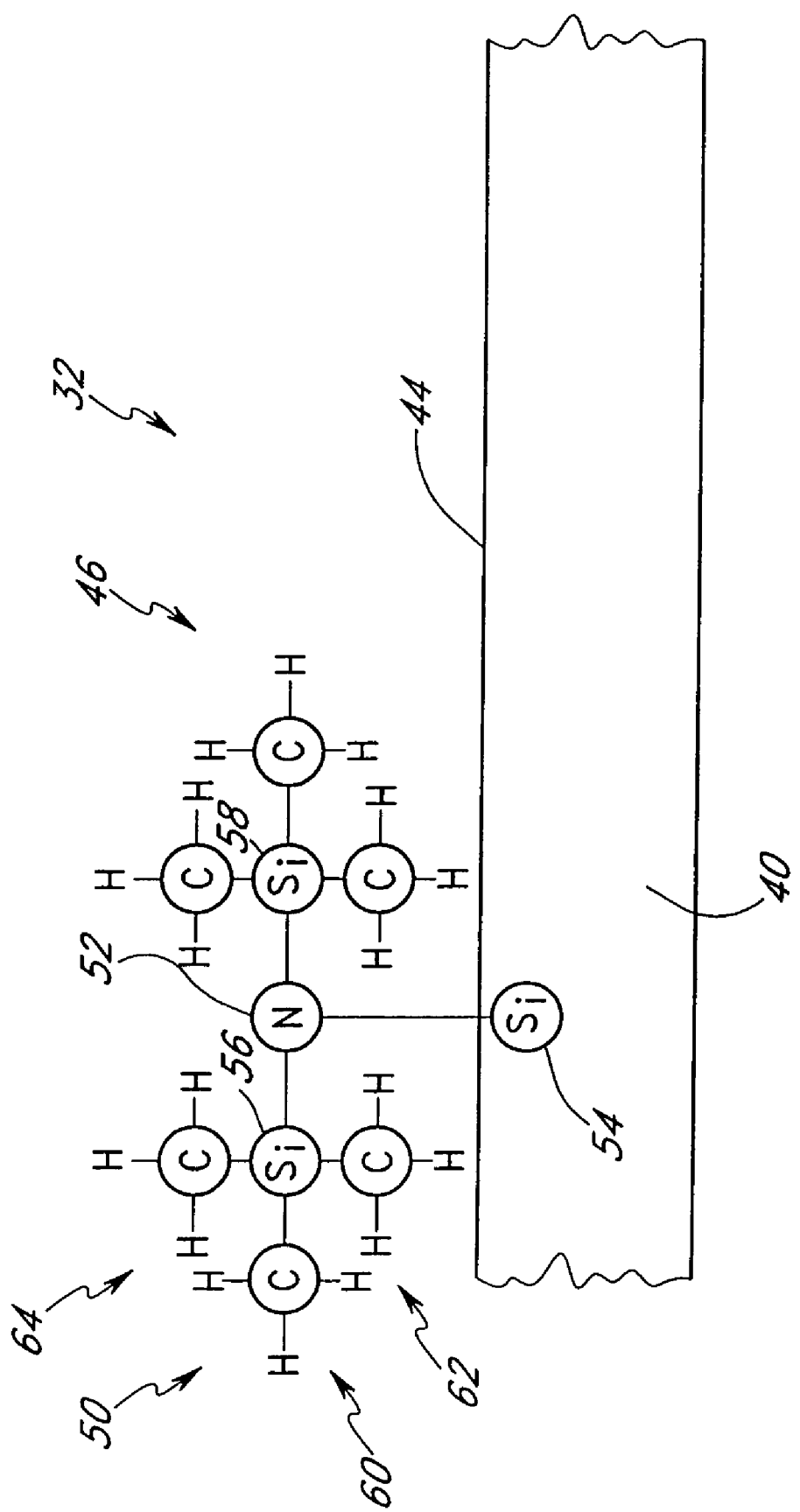
FIG. 4 is a cross-sectional diagram of the first electrode of the capacitor of FIG. 1 that schematically illustrates an interface layer comprising a plurality of adhesive molecules bonding to a first surface of a bulk layer of the first electrode.
Figure 5:
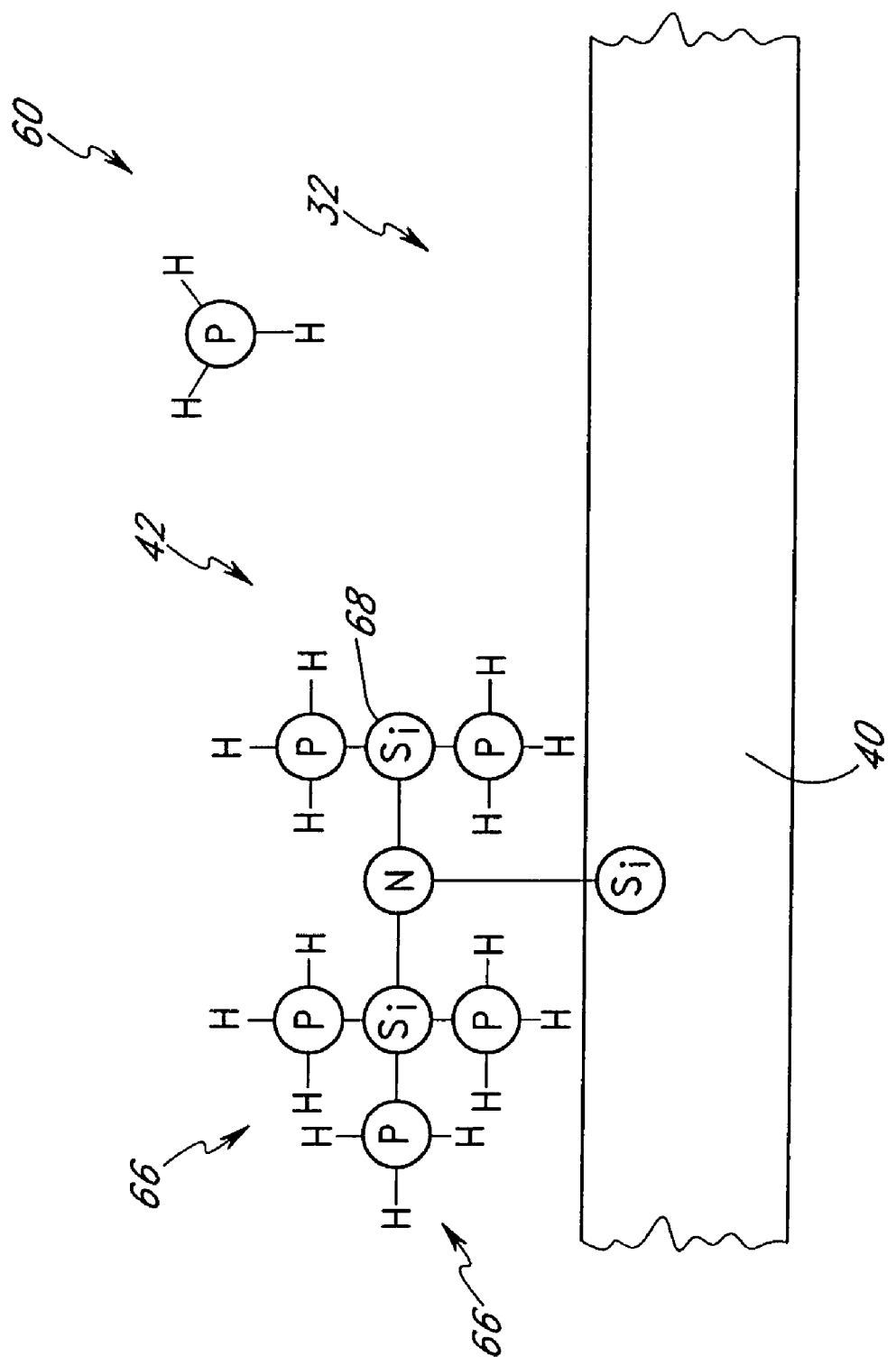
FIG. 5 is a cross-sectional diagram of the first electrode of FIG. 4 that schematically illustrates the composition of the first electrode subsequent to an annealing process.

Reference will now be made to FIGS. 3–5 which illustrate the preferred method of forming the first electrode 32 of the capacitor 30 of FIG. 1. The method comprises, in state 110, forming the bulk layer 40 of the first electrode 32 of doped semiconductor material using any of a number of known deposition methods. For example, U.S. Pat. No. 5,759,262, U.S. Pat. No. 5,882,979, U.S. Pat. No. 5,933,727, and U.S. Pat. No. 6,027,970, which are incorporated herein by reference in their entirety, disclose various acceptable methods of forming the bulk layer 40 of HSG silicon above a semiconductor substrate. However, it will be appreciated that the bulk layer 40 could be formed with a non-roughened surface using any of a number of known deposition processes, such as chemical vapor deposition (CVD), Low Pressure Chemical Vapor Deposition (LPCVD), plasma enhanced chemical vapor deposition (PECVD), physical vapor deposition (PVD), or the like, without departing from the spirit of the present invention.

After the bulk layer 40 is formed and before any subsequent layers are deposited thereon, an exposed surface 44 of the bulk layer 40 includes a plurality of bonding sites that are capable of bonding with other atoms. The bonding sites correspond to the dangling bonds of Si atoms disposed adjacent the edge of the crystal lattice of the bulk layer 40. These bonding sites can be detrimental if they bond with $O_2$ to form a layer of insulating $SiO_2$ on the surface 44 of the bulk layer 40 since the added layer of $SiO_2$ has a relatively small dielectric constant and, thus, contributes to the capacitor 30 having a reduced capacitance.

Typically, the bonding sites of a silicon electrode are passivated by annealing the electrode in a nitrogen or $NH_3$ ambient so as to form a layer of $S_{ix}N_y$ instead of $SiO_2$. Because $S_{ix}N_y$ has a larger dielectric constant, its effect on the capacitance is reduced. However, this usually requires exposing the electrode to relatively high temperatures.

In contrast to the prior art, the method of forming the first electrode 32 of the illustrated embodiment utilizes the bonding sites of the bulk layer 40 to increase the doping concentration of the first electrode 32. In particular, as shown in FIG. 3, the method of forming the first electrode 32 further comprises, in a state 112, depositing an adhesive layer 46 (FIG. 4) having a plurality of adhesive molecules over the bulk layer 40 so that a substantial portion of the adhesive molecules bonds to the bonding sites of the bulk layer 40. As will be described in greater detail below, the purpose of the adhesive layer is to attract and capture dopant atoms with relatively high affinity so that the dopant atoms are disposed substantially near the adhesive layer.

As shown in FIG. 4, in the preferred embodiment, the adhesive layer 46 comprises a plurality of hexamethldisilazane (HMDS) molecules 50. Each HMDS molecule 50 comprises a nitrogen atom 52 which is capable of bonding to a Si bonding site 54 of the bulk layer 40 of the first electrode 32. Each HMDS molecule 50 further comprises first and second silicon atoms 56 and 58 that bond to the same nitrogen atom 52. Furthermore, corresponding to each of the silicon atoms 56 and 58, each HMDS molecule 50 comprises first, second, and third $CH_3$ methyl groups 60, 62 and 64 that chemically bond to each of the silicon atoms 56, 58 of the HMDS molecule.

The HMDS adhesive layer 46 can be deposited using any of a number of conventional deposition processes. Preferably, the layer 46 is deposited using LPCVD with a pressure of 100 mTorr and a temperature of 150° C. Furthermore, the layer 46 is preferably deposited so that it conformally covers the exposed surface 44 of the bulk layer 40. In one embodiment, a substantial portion of the HMDS molecules 50 are bonded directly to the bonding sites 54 of the bulk layer 40 disposed adjacent the surface 44 of the bulk layer 40 so that the adhesive layer 46 has a thickness approximately equal to the diameter of the HMDS molecule 50.

As shown in FIG. 3, the method of forming the first electrode 32 further comprises, in a state 114, doping the adhesive layer 46 so as to transform the adhesive layer 46 into the interface layer 42 of FIG. 1. In one embodiment, doping the adhesive layer 46 comprises annealing the adhesive layer 46 in a phosphorus ambient. In particular, the adhesive layer 46 is annealed in a phosphine ambient ($PH_3$) so as to modify the composition of the layer 46. As a result, a substantial portion of the $CH_3$ methyl groups 60, 62 and 64 of the HMDS layer of FIG. 4 are replaced by $PH_3$ molecules from the ambient as shown in FIG. 5. Since each HMDS molecule includes six $CH_3$ methyl groups, each HMDS molecule can accommodate up to six $PH_3$ molecules 66 each having a phosphorus atom disposed therein that contributes to the doping concentration of the interface layer 42. Thus, the interface layer 42 can be doped with a relatively large concentration of phosphorus dopant atoms which substantially inhibits the depletion region of the first electrode 32 from extending beyond the interface layer 42 into the bulk layer 40. In one embodiment, the HMDS layer 46 is annealed in the $PH_3$ ambient at a temperature between 350° C. and 800° C. As a result, the interface layer 42 is provided with a concentration of phosphorus atoms that exceeds approximately $5 \times 10^{20}$ Atoms/cm$^3$.

As a result of depositing the adhesive layer 46 over the bulk layer 40, in the state 112, a substantial portion of the bonding sites 54 of the bulk layer 40 are no longer active and, thus, are not likely to bond with $O_2$ atoms to form capacitance reducing $SiO_2$. However, it is possible that Si bonding sites 68 within the interface layer 42 could develop as a result of stripped $CH_3$ methyl groups not being replaced by $PH_3$ molecules during the annealing process. However, as will be described in greater detail below, the remaining dangling Si bonds of the lower electrode 32 can be substantially reduced without exposing the lower electrode 32 to the relatively high temperature passivation processes required in the prior art.

As shown in FIG. 3, the method of forming the lower electrode 32 further comprises, in a state 116, passivating the interface layer 43 so as to reduce the number of dangling Si bonding sites disposed therein. Preferably, the interface layer 42 is exposed to an ambient, such as $NH_3$, that comprises nitrogen atoms so that nitrogen atoms from the ambient are attracted to the Si bonding sites 68 of the interface layer to form $Si_xN_y$. Advantageously, the activation energy required to form such bonds is less than that which is required to form $Si_xN_y$ over a conventional polysilicon surface. Thus, the layer can be passivated at a reduced temperature resulting in less diffusion.

In one embodiment, passivating the interface layer 42 comprises exposing the interface layer 42 to an $NH_3$ ambient having a pressure approximately equal to 760 Torr and a temperature approximately equal to 800° C. In comparison, prior art passivation methods require exposing the device to temperatures above 850° C.

Figure 6:
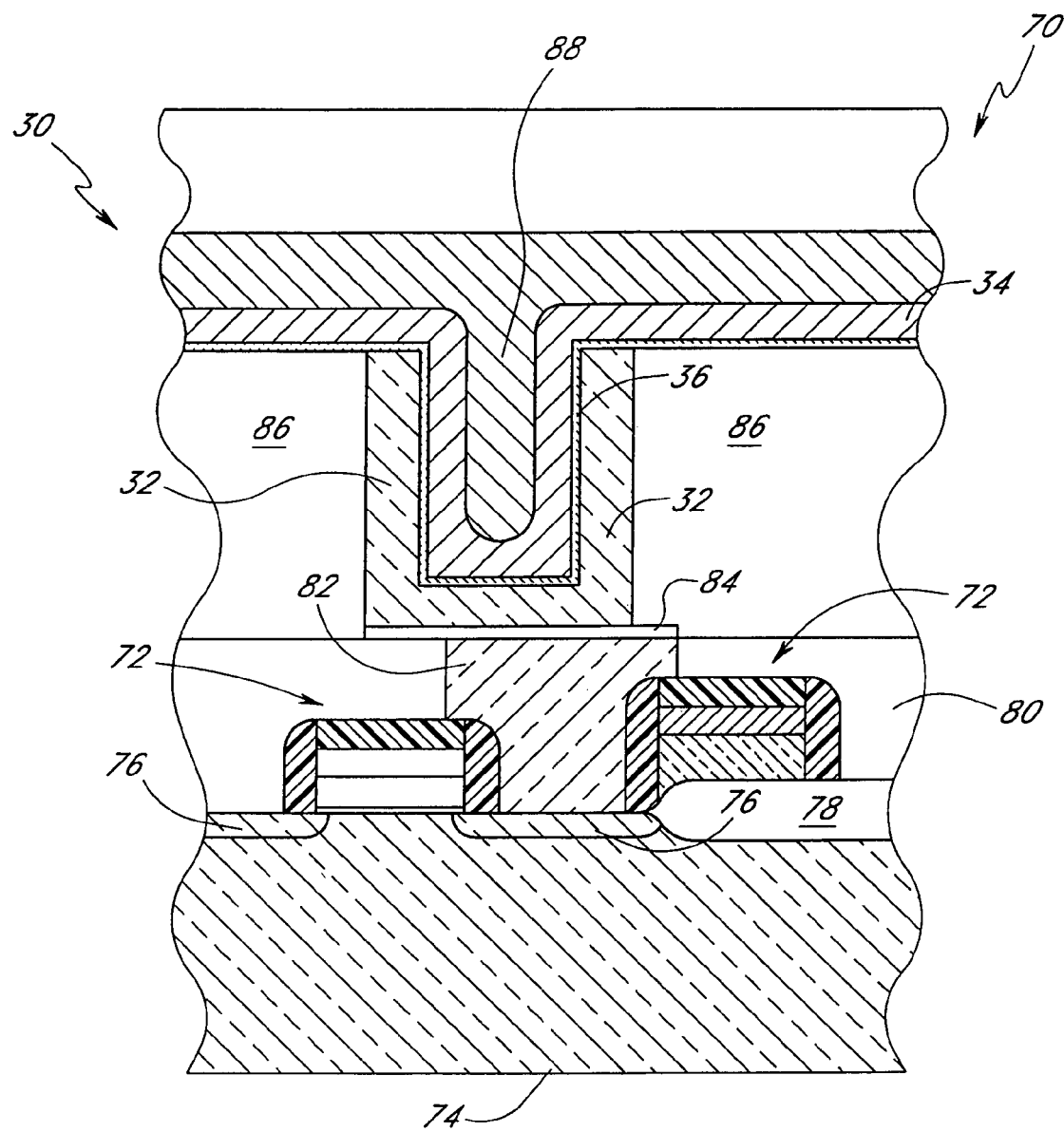
FIG. 6 is a cross-sectional schematic diagram of a DRAM device according to one embodiment of the present invention, wherein the DRAM device comprises the capacitor of FIG. 1.

Reference will now be made to FIG. 6 which illustrates an exemplary memory cell 70 of a DRAM device that includes the capacitor 30 of FIG. 1. A plurality of transistor gate electrodes 72 overlie a substrate 74, adjacent transistor active areas 76 within the substrate 74. It will be understood that several transistors are formed across a memory array within a DRAM circuit or chip. Field oxide elements 78 isolate the active areas 76 of different transistors. An insulating layer is shown covering the gate electrodes 72. A conductive contact 82, is shown extending through the insulating layer 80 to electrically contact an active area 76 between gate electrodes 72. A barrier layer 84 is formed over the conductive contact 82 and a structural layer 86 is then formed over the insulating layer and a barrier layer 32. Preferably, the structural layer 86 is selectively etchable relative to the underlying insulating layer 80. The surface area and, thus, the capacitance of the capacitor 30 of the memory cell 70 is influenced by the thickness of the structural layer 86. For the illustrated circuit, using 0.25 $\mu$m resolution, the structural layer 86 preferably has a thickness of greater than about 0.4 $\mu$m, more preferably between about 0.4 $\mu$m and 2.0 $\mu$m. A via 88 is formed in the structural layer 86 to expose the underlying contact 82, and the lower electrode 32 of the capacitor 30 of FIG. 1 is disposed over the structural layer 86 and into the via 88 to coat the inner surfaces of the via 88 and to make electrical contact with the contact 82. The insulating layer 36 of the capacitor 30 is deposited over the lower electrode 32 and the second electrode 34 is deposited over the insulating layer 36.

It will be appreciated that the capacitor 30 of the present invention and the methods for providing the same provide many advantages. In particular, the first electrode 32 of the capacitor 30 is provided with the interface layer 42 having a relatively large concentration of dopant phosphorus atoms. Furthermore, since the phosphorus atoms are chemically bonded to the interface layer 42, the phosphorus atoms are less likely to diffuse into the bulk layer 40.

Thus, the richly doped interface layer 42 of the lower electrode 32 provides the lower electrode 32 with a more localized depletion region that is disposed adjacent the insulating layer 36 of the capacitor 30. Furthermore, the extent of the depletion region is less effected by mobile charge carriers entering or exiting the lower electrode 32. Consequently, since reducing the extent of the depletion region reduces the effective distance between the charge on the lower electrode 32 and charge on the upper electrode 34, the capacitor 30 is able to have an increased capacitance that is more stable in response to changes in the voltage applied between the electrodes.

Another advantage provided by the capacitor 30 of FIG. 1 is that the interface layer 42 of the lower electrode 32 has a relatively large concentration of hydrogen atoms. In particular, hydrogen is provided by the remaining $CH_3$ methyl groups and by the PH₃ molecules inserted during the annealing process. The increased concentration of hydrogen in the interface layer 42 serves as a barrier for preventing oxygen atoms from subsequently diffusing into the lower electrode 32 and, thereby inhibits the formation of capacitance robbing $SiO_2$ within the lower electrode 32. Furthermore, the increased concentration of hydrogen in the interface layer 42 can source H atoms to the insulating layer 36 so as to nullify dangling Si bonds within the insulating layer 36. In one embodiment, the hydrogen concentration is approximately greater than $1.5 \times 10^{21}$ Atoms/cm³.

Yet another advantage provided by the capacitor 30 of the present invention is that the richly doped interface layer 42 can be passivated at a reduced temperature. This is a result of the dangling Si bonds of the interface layer requiring a reduced activation energy to form $S_xN_y$ when compared to the activation energy required to from $S_xN_y$ on a typical polysilicon surface. Consequently, the passivation process of the present invention is less damaging to other components adjacent the capacitor 30.

Although the preferred embodiment of the present invention has shown, described and pointed out the fundamental novel features of the invention as applied to this embodiment, it will be understood that various omissions, substitutions and changes in the form of the detail of the device illustrated may be made by those skilled in the art without departing from the spirit of the present invention. Consequently, the scope of the invention should not be limited to the foregoing description, but should be defined by the appended claims.

What is claimed is:

1. A method of doping a semiconductor structure, the method comprising:
   depositing a layer of adhesive material adjacent the semiconductor structure so that the adhesive material chemically bonds to a first surface of the semiconductor structure; and
   replacing a substantial portion of a plurality of CH₃ methyl groups of the adhesive material with PH₃ molecules so as to provide the semiconductor structure with a boundary layer having a first concentration of phosphorus atoms that are chemically bonded to the boundary layer.

2. The method of claim 1, further comprising passivating the boundary layer so as to nullify a substantial portion of the dangling bonds of the boundary layer.

3. The method of claim 2, wherein passivating the boundary layer comprises raising the temperature of the boundary layer to 800° C. and exposing the boundary layer to an ambient that comprises nitrogen atoms.

4. The method of claim 3, wherein exposing the boundary layer to an ambient that comprises nitrogen atoms comprises exposing the boundary layer to NH₃.

5. The method of claim 1, wherein depositing a layer of adhesive material adjacent the semiconductor structure comprises depositing a layer of hexamethldisilazane (HMDS) material.

6. The method of claim 5, wherein depositing a layer of HMDS material comprises depositing a layer of HMDS material using LPCVD with a pressure of 100 mTorr and a temperature of 150° C.

7. The method of claim 6, wherein replacing a substantial portion of a plurality of CH₃ methyl groups of the adhesive material with PH₃ molecules comprises annealing the layer of adhesive material in a phosphine ambient.

8. The method of claim 7, wherein annealing the layer of adhesive material in a phosphine ambient comprises raising the temperature of the adhesive material to a temperature between 550 and 800 degrees Celsius.

9. A method of forming a capacitor, the method comprising:
   forming a bulk layer of doped polysilicon;
   depositing a layer of adhesive material adjacent a first surface of the bulk layer, said adhesive material comprising a plurality of CH₃ methyl groups;
   replacing a substantial portion of the plurality of CH₃ methyl groups of the adhesive material with PH₃ molecules so as to provide an interface layer having a relatively large concentration of phosphorus dopant atoms;
   passivating the interface layer so as to inhibit the formation of silicon dioxide therein;
   depositing an insulating layer adjacent the interface layer; and
   depositing an electrode adjacent the insulating layer.

10. A method of forming a capacitor on a semiconductor wafer comprising:
    forming a first electrode on a surface of the semiconductor wafer;
    attaching an adhesive layer to an exposed surface of the first electrode;
    transforming the adhesive layer into a doped layer wherein the doped layer is doped so as to provide an increased concentration of charge carrier adjacent an interface surface of the first electrode;
    forming a dielectric layer on the interface surface of the first electrode;
    wherein forming a first electrode comprises depositing HSG silicon on a surface above the semiconductor wafer.

11. The method of claim 10, wherein attaching an adhesive layer to an exposed surface of the first electrode comprises depositing a layer of material that have a plurality of first components and second components wherein the plurality of first components are selected to chemically bond to the first electrode.

12. The method of claim 11, wherein transforming the adhesive layer comprises replacing at least some of the plurality of second components with dopant atoms to thereby increase the dopant concentration at the interface surface.

13. The method of claim 12, wherein attaching the adhesive layer comprises attaching a layer having a plurality of CH₃ methyl groups to the first electrode.

14. The method of claim 13, wherein transforming the adhesive layer comprises replacing a substantial portion of the plurality of CH₃ methyl groups of the adhesive material with PH₃ molecules so as to provide an interface surface having an increased concentration of phosphorus dopant atoms.

15. A method of forming a capacitor, the method comprising:
    forming a first conducting electrode having a bulk layer and an interface layer chemically bonded to the bulk layer, wherein the interface layer comprises a plurality of doping atoms chemically bonded thereto, said interface layer reducing the depletion region of the first conducting electrode;
    forming an insulating layer adjacent the first conducting electrode such that the insulating layer is disposed adjacent the interface layer of the first conducting electrode; and forming a second conducting electrode adjacent the insulating layer such that the insulating layer is interposed between the first and second conducting electrodes;

wherein forming said interface layer comprises depositing a layer of adhesive material on a first surface of the bulk layer, wherein the adhesive material comprises a plurality of methyl ($CH_3$) groups; and annealing the layer of adhesive material in a phosphine ambient so as to replace a substantial portion of the $CH_3$ methyl groups of the adhesive material with $PH_3$.

16. The method of claim 15, wherein forming the interface layer further comprises passivating the interface layer so as to inhibit the formation of silicon dioxide.

* * * * *